（12） United States Patent
Meguro

(10) Patent No.: US 6,235,589 B1
(45) Date of Patent: May 22, 2001

(54) METHOD OF MAKING NON-VOLATILE MEMORY WITH POLYSILICON SPACERS

(75) Inventor: Hisataka Meguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/494,435

(22) Filed: Jan. 31, 2000

(30) Foreign Application Priority Data

Jan. 7, 2000 (JP) .................................................. 12-001834

(51) Int. Cl.[7] .............................................. H01L 21/8247
(52) U.S. Cl. ........................ 438/267; 438/296; 438/304; 438/596
(58) Field of Search .................................. 438/257, 259, 438/264, 267, 296, 304, 596

(56) References Cited

U.S. PATENT DOCUMENTS 5,081,057 * 1/1992 Corda .................................... 438/596
5,268,585 * 12/1993 Yamauchi ............................. 438/267
5,915,176 * 6/1999 Lim ....................................... 438/304
6,171,909 * 1/2001 Ding et al. ............................ 438/267
6,172,394 * 1/2001 Nakagawa ............................ 438/304

FOREIGN PATENT DOCUMENTS 7-58221  3/1995  (JP) .

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

Sidewall spacers comprised of a second polycrystalline silicon film are formed on the sides of a first polycrystalline silicon film in such a way that a relationship of $b \leq a = x < c/2$ is satisfied where x is the thickness of the sidewall spacers, a is a distance from the surface of the first insulating film to the surface of the first polycrystalline silicon film, b is the thickness of the second polycrystalline silicon film at a time of formation thereof and c is a distance between adjoining first polycrystalline silicon films.

9 Claims, 8 Drawing Sheets

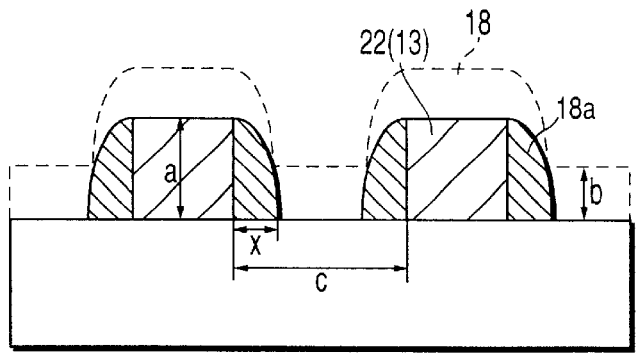
F I G. 13
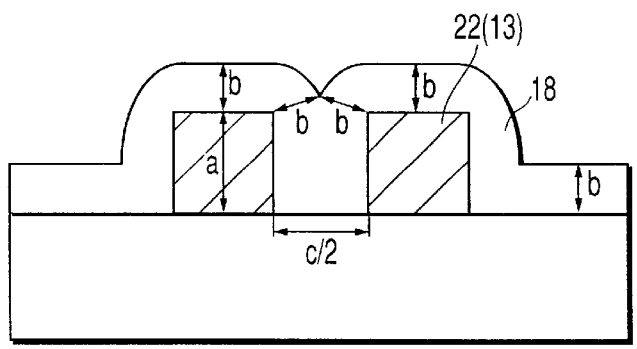
F I G. 14
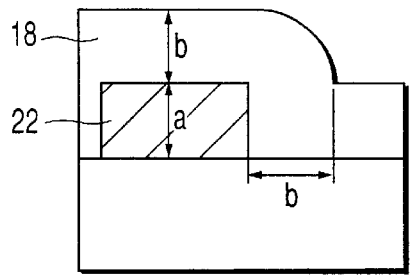
F I G. 15A
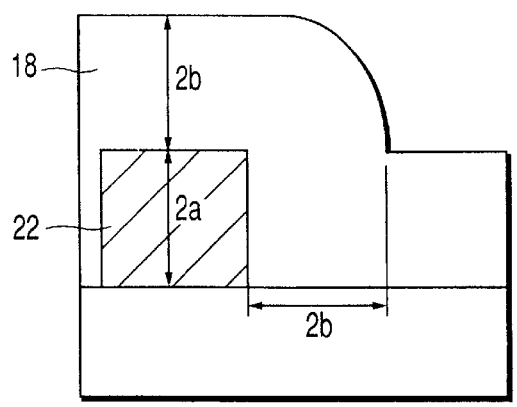
F I G. 15B

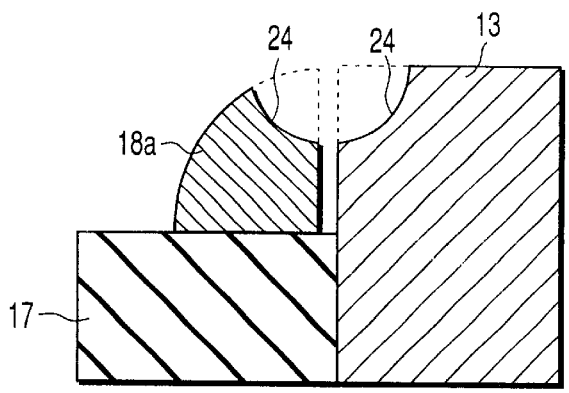
F I G. 22
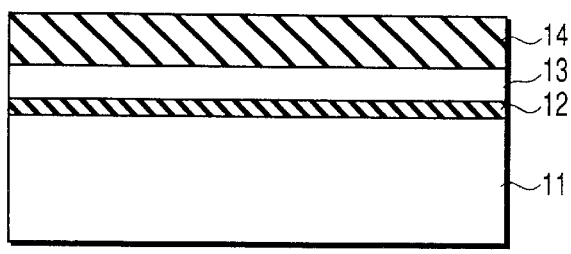
F I G. 23
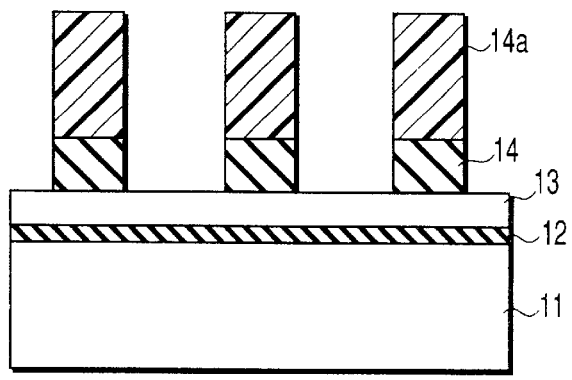
F I G. 24
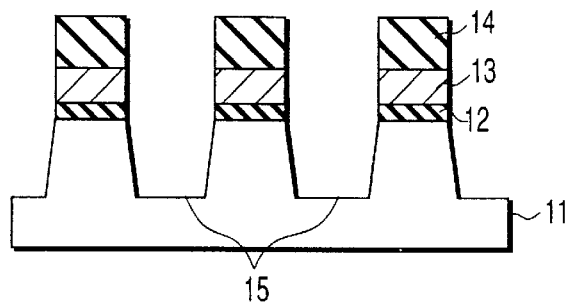
F I G. 25

METHOD OF MAKING NON-VOLATILE MEMORY WITH POLYSILICON SPACERS

CROSS-REFERENCE TO RELATED APPLICATION

This application is based upon and claims the benefit of priority from the prior Japanese Patent Application No. 12-001834, filed Jan. 7, 2000, the entire contents of which are incorporated herein by reference.

BACKGROUND OF THE INVENTION

The present invention relates to a non-volatile semiconductor memory and, more particularly, to a semiconductor device having a memory cell array structure and a method of fabricating the same.

There is a non-volatile semiconductor memory which has a gate electrode with a miniaturized double-layer stacked structure and memory transistors. The following describes a method of fabricating a non-volatile semiconductor memory having a memory cell array structure according to one prior art.

First, as shown in FIG. 23, a gate oxide film 12 having a thickness of, for example, 80 Å is formed on a silicon substrate 11, and a first polycrystalline silicon film 13 having a thickness of, for example, 1000 Å is formed on this gate oxide film 12. Formed on this first polycrystalline silicon film 13 is a silicon nitride film 14 with a thickness of, for example, 1500 Å, which becomes an etching mask material.

Next, as shown in FIG. 24, a resist 14a is formed on the silicon nitride film 14 and is then patterned by photolithography. With the patterned resist 14a as a mask, the silicon nitride film 14 is removed by anisotropic dry etching. Thereafter, the resist 14a is removed by wet etching.

Then, as shown in FIG. 25, with the patterned silicon nitride film 14 as a mask, the first polycrystalline silicon film 13, the gate oxide film 12 and the silicon substrate 11 are etched to a desired depth by anisotropic dry etching, thereby forming trenches 15.

Then, as shown in FIG. 26, an oxide film 16 having a thickness of, for example, 100 Å is formed on the exposed surfaces of the silicon substrate 11 and the first polycrystalline silicon film 13 in order to recover from the damage on the etched surface of the silicon substrate 11.

Next, a buried insulating film 17 with a thickness of, for example, 6000 Å is formed on the entire surface, burying the trenches 15, as shown in FIG. 27. The buried insulating film 17 is then planarized to the desired height by CMP (Chemical Mechanical Polish), thus exposing the surface of the silicon nitride film 14. Thereafter, the silicon nitride film 14 is removed by wet etching, forming device regions 11a and device isolation regions 11b, as shown in FIG. 28.

Then, as shown in FIG. 29, a second polycrystalline silicon film 18 having a thickness of, for example, 1000 Å is formed on the entire surface. Then, a resist 14b is deposited on the second polycrystalline silicon film 18 and is patterned as shown in FIG. 30. With this patterned resist 14b as a mask, the second polycrystalline silicon film 18 is removed by anisotropic dry etching, thereby forming slits 18b, as shown in FIG. 31. Thereafter, the resist 14b is removed.

Then, an ONO film (a multilayer film consisting of a silicon oxide film/silicon nitride film/silicon oxide film) 19 having a thickness of, for example, 120 Å is formed on is formed on the entire surface, as shown in FIG. 32. Then, as shown in FIG. 33, a third polycrystalline silicon film 20 with a thickness of, for example, 1000 Å is formed on the ONO film 19, a high-melting-point silicide film 21 with a thickness of, for example, 500 Å is formed on is formed on this third polycrystalline silicon film 20.

Thereafter, to form word lines, the high-melting-point silicide film 21, the third polycrystalline silicon film 20, the ONO film 19, the second polycrystalline silicon film 18 and the first polycrystalline silicon film 13 are processed in order by anisotropic dry etching. Through the above procedures, memory cells (not shown) are formed.

According to this conventional non-volatile memory, a voltage of about 20 V is applied to the high-melting-point silicide film 21, thereby generating FN (Fowler-Nordherm) current in the gate oxide film 12. As a result, electrons are injected into the first polycrystalline silicon film 13. Meanwhile, a voltage of about 20 V is applied to the silicon substrate 11, thereby generating FN current in the gate oxide film 12. Accordingly, electrons are emitted from the first polycrystalline silicon film 13.

The injection and emission of electrons are accomplished by the FN current that is generated in the gate oxide film 12. The level of this FN current is determined by the potential of the floating gate electrode that is comprised of the first and second polycrystalline silicon films 13 and 18. The potential of this floating gate electrode is determined by the coupling ratio of the capacitance of the gate oxide film 12 to that of the ONO film 19. That is, the coupling ratio of the capacitance of the gate oxide film 12 to that of the ONO film 19 becomes important at the time of electron injection and emission.

Given that the capacitance of the gate oxide film 12 is C1 and the capacitance of the ONO film 19 is C2, the coupling ratio satisfies the relationship of an equation 1 below.

$$C=C2/(C1+C2) \tag{1}$$

The capacitance C2 of the ONO film 19 satisfies the relationship of the following equation 2:

$$C2=\epsilon \times S/d \tag{2}$$

where S is the surface area of the ONO film 19, d is the thickness of the ONO film 19 and $\epsilon$ is a dielectric constant.

To increase the potential of the floating gate electrode, the coupling ratio C given by the equation 1 should be increased. To increase the coupling ratio C, the thickness of the ONO film 19 may be reduced or the surface area of the ONO film 19 may be increased as apparent from the equation 2.

If the ONO film 19 becomes thinner, however, the leak current is produced. As a result, the reliability of the ONO film 19 cannot be secured. Further, the surface area of the ONO film 19 depends on the size of the opening of the slits 18b. In the formation of the slits 18b shown in FIG. 31, however, the demanded precision for the slits 18b is severer than the one that can be adjusted by the state-of-the-art technology. It is therefore difficult to meet the strict size precision for the slits 18b according to the current design rules. This makes it hard to increase the surface are of the ONO film 19.

As apparent from the above, the use of the conventional fabrication method faces a difficulty in designing miniaturized devices, and cannot provide highly reliable semiconductor devices.

BRIEF SUMMARY OF THE INVENTION

Accordingly, it is an object of the present invention to provide a semiconductor device which facilitates designing of miniaturized devices and has an improved reliability, and a method of fabricating this semiconductor device.

To achieve this object, according to one aspect of this invention, there is provided a semiconductor device comprising a trench for isolating device regions in a semiconductor substrate; a gate oxide film formed on the device regions; a first polycrystalline silicon film formed on the gate oxide film; a first insulating film for exposing an upper portion of the first polycrystalline silicon film and burying the trench; sidewall spacers comprised of a second polycrystalline silicon film formed on sides of the exposed upper portion of the first polycrystalline silicon film; and an ONO film formed on an entire surface.

In this semiconductor device, a relationship of $b \leq a = x < c/2$ may be satisfied where x is a thickness of the sidewall spacers, a is a distance from a surface of the first insulating film to a surface of the first polycrystalline silicon film, b is a thickness of the second polycrystalline silicon film at a time of formation thereof and c is a distance between adjoining first polycrystalline silicon films.

The semiconductor device may further comprise a second insulating film formed between the first polycrystalline silicon film and the sidewall spacers; and recesses formed in upper portions of the sidewall spacers and an upper edge portion of the first polycrystalline silicon film.

In this modification of the semiconductor device, a relationship of $b \leq a = x < c/2$ may be satisfied where x is a thickness of the sidewall spacers, a is a distance from a surface of the first insulating film to a surface of the first polycrystalline silicon film, b is a thickness of the second polycrystalline silicon film at a time of formation thereof and c is a distance between adjoining first polycrystalline silicon films.

The second insulating film may have a thickness of 20 Å to 40 Å. Further, impurities of a same kind may be doped in the first polycrystalline silicon film and the second polycrystalline silicon film.

According to another aspect of this invention, there is provided a method of fabricating a semiconductor device comprising the steps of forming a gate oxide film on a semiconductor substrate; forming a first polycrystalline silicon film on the gate oxide film; forming a first insulating film on the first polycrystalline silicon film and then patterning the first insulating film; removing the first polycrystalline silicon film and the gate oxide film with the patterned first insulating film used as a mask, thereby exposing a surface of the semiconductor substrate; removing the exposed area of the semiconductor substrate to a desired depth, thereby forming a trench in the semiconductor substrate; forming an oxide film on exposed surfaces of the semiconductor substrate and the first polycrystalline silicon film; forming a second insulating film on an entire surface, thereby burying the trench; planarizing the second insulating film, thereby exposing a surface of the first insulating film; removing the first insulating film; removing the second insulating film and the oxide film, thereby exposing an upper portion of the first polycrystalline silicon film; forming a second polycrystalline silicon film on an entire surface; removing the second polycrystalline silicon film, thereby forming sidewall spacers on sides of the first polycrystalline silicon film; and forming an ONO film on an entire surface.

In this fabrication method, a relationship of $b \leq a = x < c/2$ may be satisfied where x is a thickness of the sidewall spacers, a is a distance from a surface of the first insulating film to a surface of the first polycrystalline silicon film, b is a thickness of the second polycrystalline silicon film at a time of formation thereof and c is a distance between adjoining first polycrystalline silicon films.

In this method, impurities of a same kind may be doped in the first polycrystalline silicon film and the second polycrystalline silicon film. Further, the sidewall spacers may be formed by anisotropic dry etching.

According to a still further aspect of this invention, there is provided a method of fabricating a semiconductor device comprising the steps of forming a gate oxide film on a semiconductor substrate; forming a first polycrystalline silicon film on the gate oxide film; forming a first insulating film on the first polycrystalline silicon film and then patterning the first insulating film; removing the first polycrystalline silicon film and the gate oxide film with the patterned first insulating film used as a mask, thereby exposing a surface of the semiconductor substrate; removing the exposed area of the semiconductor substrate to a desired depth, thereby forming a trench in the semiconductor substrate; forming an oxide film on exposed surfaces of the semiconductor substrate and the first polycrystalline silicon film; forming a second insulating film on an entire surface, thereby burying the trench; planarizing the second insulating film, thereby exposing a surface of the first insulating film; removing the first insulating film; removing the second insulating film and the oxide film, thereby exposing an upper portion of the first polycrystalline silicon film; forming a third insulating film in such a way as to cover the exposed upper portion of the first polycrystalline silicon film; forming a second polycrystalline silicon film on an entire surface; removing the second polycrystalline silicon film and the third insulating film, thereby forming sidewall spacers on sides of the first polycrystalline silicon film via the third insulating film; etching back parts of the sidewall spacers and the first polycrystalline silicon film, thereby forming recesses in upper portions of the sidewall spacers and an upper edge portion of the first polycrystalline silicon film; and forming an ONO film on an entire surface.

In this fabrication method, a relationship of $b \leq a = x < c/2$ may be satisfied where x is a thickness of the sidewall spacers, a is a distance from a surface of the first insulating film to a surface of the first polycrystalline silicon film, b is a thickness of the second polycrystalline silicon film at a time of formation thereof and c is a distance between adjoining first polycrystalline silicon films.

In the method, impurities of a same kind may be doped in the first polycrystalline silicon film and the second polycrystalline silicon film. Further, the sidewall spacers may be formed by anisotropic dry etching. Furthermore, the second insulating film may have a thickness of 20 Å to 40 Å.

As described above, the present invention to provide a semiconductor device which facilitates designing of miniaturized devices and has an improved reliability, and a method of fabricating this semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a diagram illustrating a relationship between the height, a, of a gate electrode and the thickness, b, of a second polycrystalline silicon film according to the first embodiment of this invention;

FIG. 14 is a diagram illustrating a relationship between the thickness b of the second polycrystalline silicon film and a distance c between adjoining gate electrodes according to the first embodiment of this invention;

FIGS. 15A and 15B are diagrams showing a relationship between the height a of the gate electrode and the thickness b of the second polycrystalline silicon film according to the first embodiment of this invention;

FIG. 22 is a cross-sectional view of a step of fabrication of the semiconductor device according to the second embodiment of this invention, following the step of FIG. 21;

FIG. 23 is a cross-sectional view of a step of fabrication of a semiconductor device according to prior art;

FIG. 24 is a cross-sectional view of a step of fabrication of the semiconductor device according to the prior art, following the step of FIG. 23;

FIG. 25 is a cross-sectional view of a step of fabrication of the semiconductor device according to the prior art, following the step of FIG. 24;

DETAILED DESCRIPTION OF THE INVENTION

Preferred embodiments of the present invention will now be described with reference to the accompanying drawings.

FIRST EMBODIMENT

Figure 1:
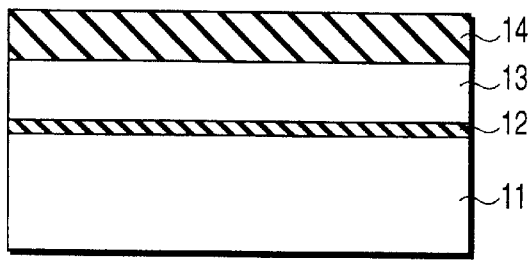
FIG. 1 is a cross-sectional view of a step of fabrication of a semiconductor device according to a first embodiment of this invention.

First, as shown in FIG. 1, a gate oxide film 12 having a thickness of, for example, 80 Å is formed on the flat surface of a silicon substrate 11, and a first polycrystalline silicon film 13 having a thickness of, for example, 1500 Å is formed on this gate oxide film 12. Formed on this first polycrystalline silicon film 13 is a silicon nitride film 14 with a thickness of, for example, 1500 Å, which becomes an etching mask material.

Figure 2:
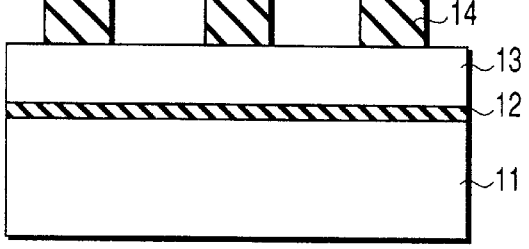
FIG. 2 is a cross-sectional view of a step of fabrication of the semiconductor device according to the first embodiment of this invention, following the step of FIG. 1.

Next, as shown in FIG. 2, a resist 14a is formed on the silicon nitride film 14 and is then patterned by photolithography. With the patterned resist 14a as a mask, the silicon nitride film 14 is removed by anisotropic dry etching. Thereafter, the resist 14a is removed by wet etching.

Figure 3:
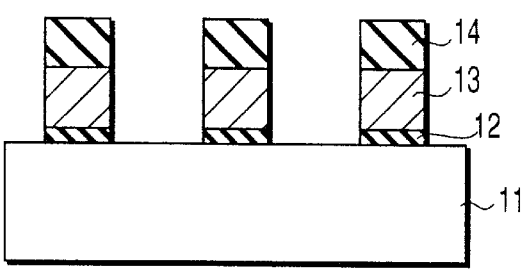
FIG. 3 is a cross-sectional view of a step of fabrication of the semiconductor device according to the first embodiment of this invention, following the step of FIG. 2.

Then, as shown in FIG. 3, with the patterned silicon nitride film 14 as a mask, the first polycrystalline silicon film 13 and the gate oxide film 12 are etched.

Figure 4:
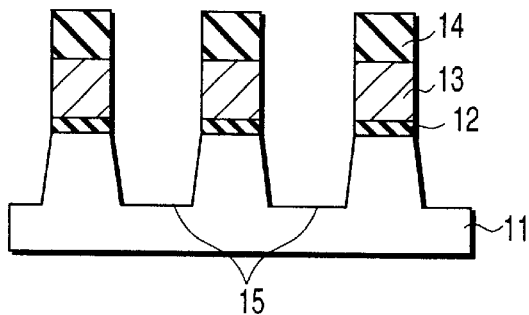
FIG. 4 is a cross-sectional view of a step of fabrication of the semiconductor device according to the first embodiment of this invention, following the step of FIG. 3.
Figure 5:
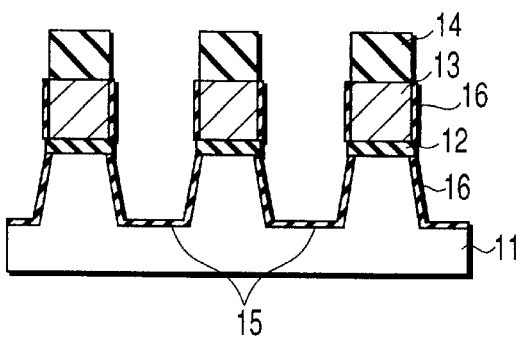
FIG. 5 is a cross-sectional view of a step of fabrication of the semiconductor device according to the first embodiment of this invention, following the step of FIG. 4.

Then, as shown in FIG. 4, the silicon substrate 11 is etched to a desired depth by anisotropic dry etching, thereby forming trenches 15 in the silicon substrate 11. Thereafter, in order to recover from the damage on the etched surface of the silicon substrate 11, an oxide film 16 having a thickness of, for example, 100 Å is formed on the exposed surfaces of the silicon substrate 11 and the first polycrystalline silicon film 13 as shown in FIG. 5.

Figure 6:
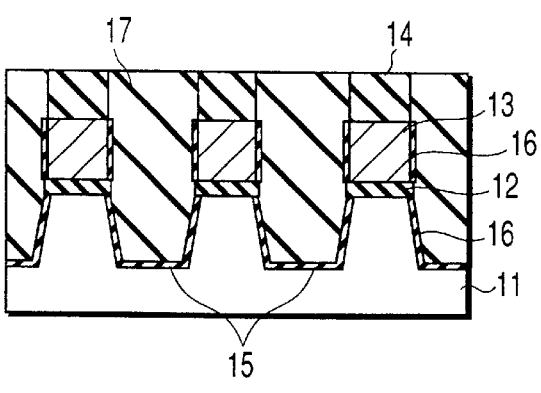
FIG. 6 is a cross-sectional view of a step of fabrication of the semiconductor device according to the first embodiment of this invention, following the step of FIG. 5.
Figure 7:
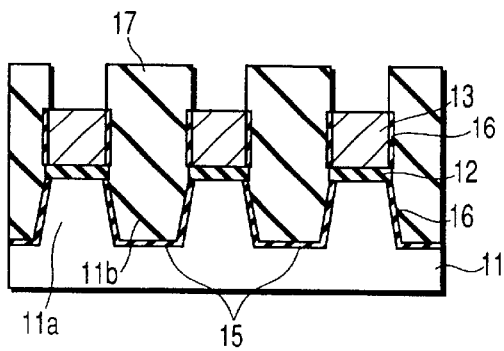
FIG. 7 is a cross-sectional view of a step of fabrication of the semiconductor device according to the first embodiment of this invention, following the step of FIG. 6.

Next, a buried insulating film 17 with a thickness of, for example, 6000 Å is formed on the entire surface, burying the trenches 15, as shown in FIG. 6. The buried insulating film 17 is then planarized to the desired height by CMP, thus exposing the surface of the silicon nitride film 14. Thereafter, the silicon nitride film 14 is removed by wet etching, forming device regions 11a and device isolation regions 11b, as shown in FIG. 7.

Figure 8:
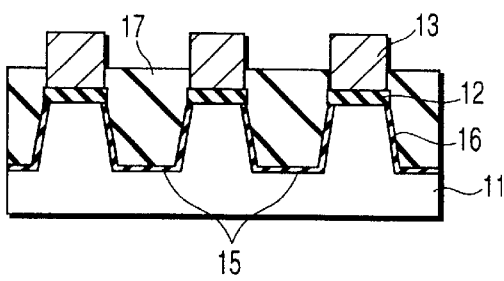
FIG. 8 is a cross-sectional view of a step of fabrication of the semiconductor device according to the first embodiment of this invention, following the step of FIG. 7.
Figure 9:
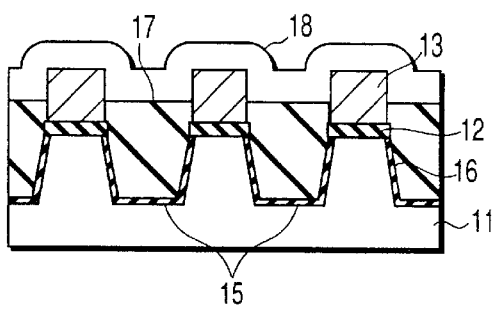
FIG. 9 is a cross-sectional view of a step of fabrication of the semiconductor device according to the first embodiment of this invention, following the step of FIG. 8.
Figure 10:
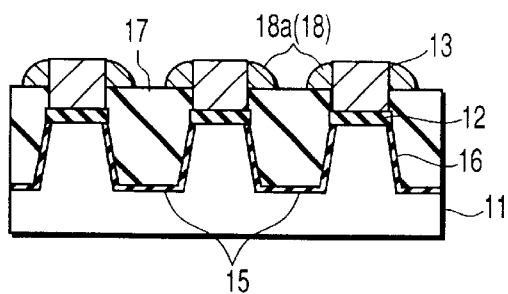
FIG. 10 is a cross-sectional view of a step of fabrication of the semiconductor device according to the first embodiment of this invention, following the step of FIG. 9.

Then, the buried insulating film 17 and the oxide film 16 are removed, thus exposing the upper portion of the first polycrystalline silicon film 13, as shown in FIG. 8. Then, as shown in FIG. 9, a second polycrystalline silicon film 18 having a thickness of, for example, 600 Å is formed on the entire surface. The second polycrystalline silicon film 18 is doped with an impurity of the same kind as the one doped in the first polycrystalline silicon film 13. Then, the second polycrystalline silicon film 18 is removed by anisotropic dry etching, thereby forming sidewall spacers 18a on the sides of the first polycrystalline silicon film 13, as shown in FIG. 10.

Figure 11:
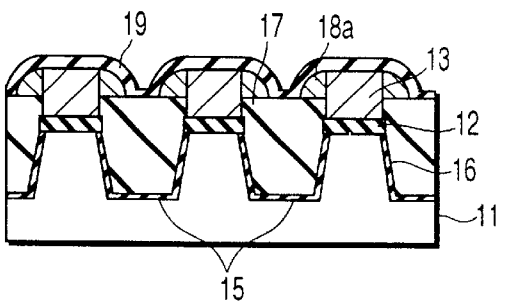
FIG. 11 is a cross-sectional view of a step of fabrication of the semiconductor device according to the first embodiment of this invention, following the step of FIG. 10.
Figure 12:
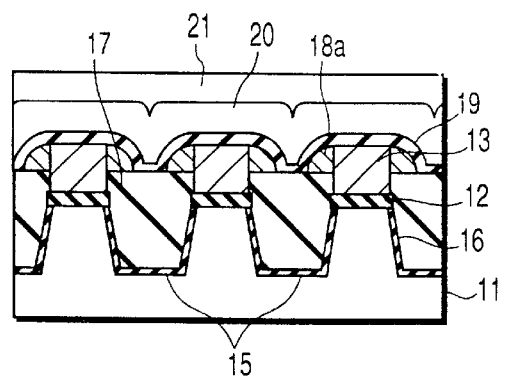
FIG. 12 is a cross-sectional view of a step of fabrication of the semiconductor device according to the first embodiment of this invention, following the step of FIG. 11.

Then, an ONO film 19 having a thickness of, for example, 120 Å is formed on the entire surface, as shown in FIG. 11. Then, as shown in FIG. 12, a third polycrystalline silicon film 20 with a thickness of, for example, 1000 Å is formed on the ONO film 19, a high-melting-point silicide film 21 with a thickness of, for example, 500 Å is formed on this third polycrystalline silicon film 20.

Thereafter, to form word lines, the high-melting-point silicide film 21, the third polycrystalline silicon film 20, the ONO film 19, the second polycrystalline silicon film 18 and the first polycrystalline silicon film 13 are processed in order by anisotropic dry etching. Through the above procedures, memory cells (not shown) are formed.

Referring now to FIGS. 13 to 15, a description will now be given of the conditions that maximize the thickness x of the sidewall spacers 18a in order to secure a large surface area of the ONO film.

To begin with, the range for the thickness b of the second polycrystalline silicon film 18 will be discussed as the first condition. As shown in FIG. 13, to adequately form the sidewall spacers 18a on the sides of the gate electrode 22 comprised of the first polycrystalline silicon film 13, the height a of the gate electrode 22 and the thickness b of the second polycrystalline silicon film 18 should satisfy the relationship of an equation 3 below.

$$a \leq b \quad (3)$$

The second condition will now be discussed. As shown in FIG. 14, when the thickness b of the second polycrystalline silicon film 18 is larger than half the distance c between the adjoining gate electrodes 22, the space between the adjoining gate electrodes 22 is buried with the second polycrystalline silicon film 18 so that those gate electrodes 22 contact each other. This therefore demands that the thickness b of the second polycrystalline silicon film 18 be smaller than half the distance c between the adjoining gate electrodes 22, as apparent from the following equation 4.

$$b < c/2 \quad (4)$$

Now, the maximum value of the thickness x of the sidewall spacers 18a will be discussed as the third condition. This thickness x of the sidewall spacers 18a is determined by the thickness b of the second polycrystalline silicon film 18. As shown in FIGS. 15A and 15B, if the height a of the gate electrode 22 is set twice as high, i.e., 2a, the second polycrystalline silicon film 18 can be formed to 2b, double the original thickness. To maximize the thickness b of the second polycrystalline silicon film 18, therefore, the thickness b of the second polycrystalline silicon film 18 should be made equal to the height a of the gate electrode 22. That is, setting the thickness x of the sidewall spacers 18a equal to the height a of the gate electrode 22, maximizes the thickness x of the sidewall spacers 18a.

From the first to third conditions, therefore, the thickness x of the sidewall spacers 18a becomes maximum when the relationship of the following equation 5 is met. This makes it possible to secure a sufficient surface area for the ONO film.

$$b \leq a = x < c/2 \quad (5)$$

Next, the height a2 of the gate electrode 22b and the thickness x of the sidewall spacers 18a according to the first embodiment are calculated using the equation 5.

Figure 16:
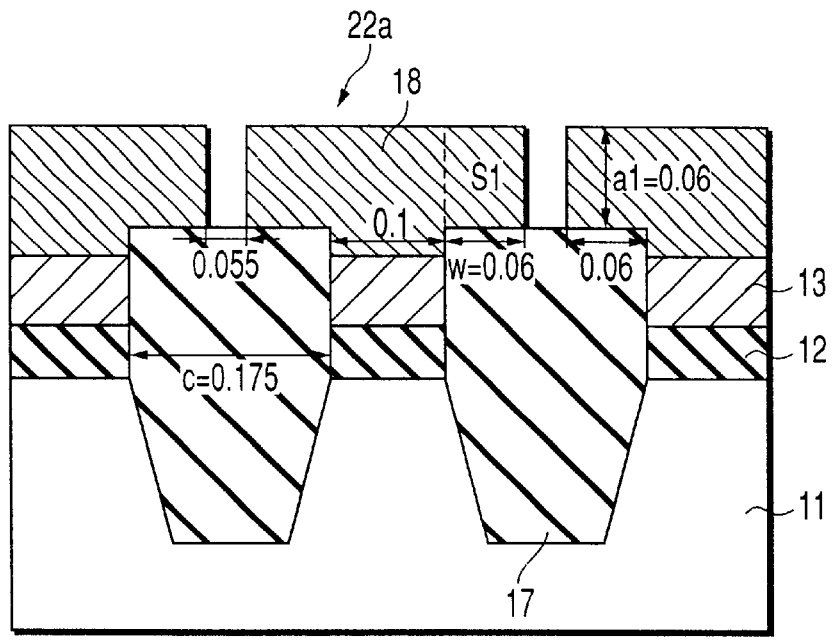
FIG. 16 is a cross-sectional view of a step of fabrication of the semiconductor device according to the first embodiment of this invention, following the step of FIG. 3.
Figure 17:
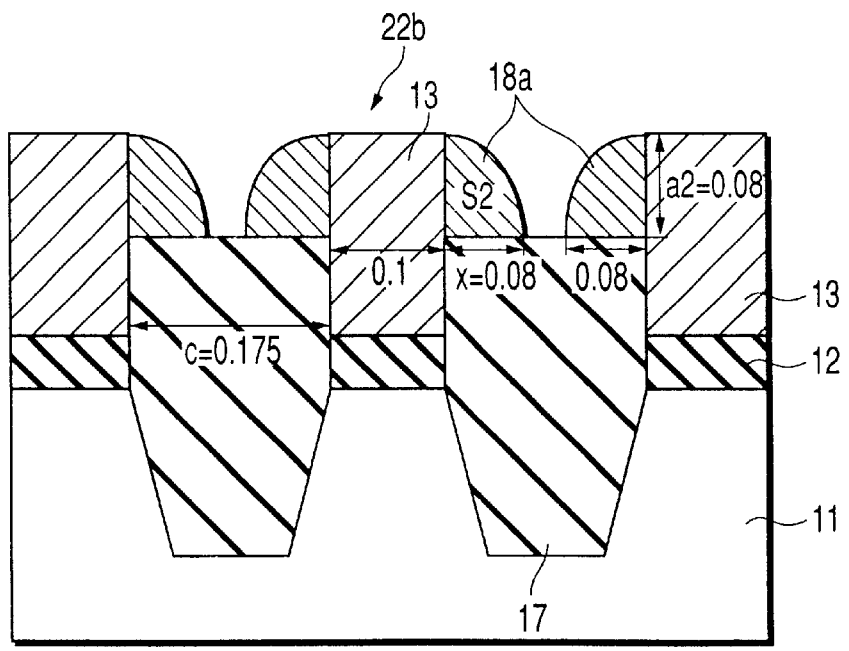
FIG. 17 is a cross-sectional view of a step of fabrication of the semiconductor device according to the first embodiment of this invention, following the step of FIG. 4.

Assume that the height a1 of the gate electrode 22a according to the prior art is 0.06μ, the distance c between the adjoining gate electrodes 22a is 0.175 μm, the wing length W of the gate electrode 22a is 0.06 μm and the unit surface area of one wing length portion, S1, is equal to W+a1, as shown in FIG. 16. Also assume that the gate electrode 22b according to the first embodiment has a height a2, the distance between the adjoining gate electrodes 22b is c, the thickness of the sidewall spacers 18a is x and the unit surface area of one sidewall spacer 18a is S2 (=2 πx/4), as shown in FIG. 17.

To secure a larger surface area for the ONO film (not shown), it is desirable to make large the surface area of the gate electrode 22b of the first embodiment greater than that of the conventional gate electrode 22a. From S2<S2, therefore, an equation 6 below is derived.

$$x > 4W/\pi \quad (6)$$

From this equation 6, the condition for the thickness x of the sidewall spacers 18a is acquired as given by the following equation 7.

$$x > 0.076 \, \mu m \quad (7)$$

To prevent adjoining sidewall spacers 18a from contacting each other, as indicated by the equation 5, the thickness x of the sidewall spacers 18a is made smaller than half the distance c between the adjoining gate electrodes 22b. Given that the distance c between the adjoining gate electrodes 22b is 0.175 μm, therefore, the range for the thickness x of the sidewall spacers 18a is obtained as given by the following equation 8.

$$0.076 \, \mu m < x < 0.0875 \, \mu m \quad (8)$$

From the equation 5, the height a2 of the gate electrode 22b is equal to the thickness x of the sidewall spacers 18a. From this, therefore, the range for the height a2 of the gate electrode 22b is obtained as given by an equation 9 below.

$$0.076 \, \mu m < a2 < 0.0875 \, \mu m \quad (9)$$

If the distance c between the adjoining gate electrodes 22b is set to 0.175 μm, it is apparent from the above that the height a2 of the gate electrode 22b and the thickness x of the sidewall spacers 18a should be set to, for example, 0.08 μm. Therefore, the unit surface area S2 in the first embodiment becomes 0.3512 μm² whereas the unit surface area S1 in the prior art was 0.34 μm². Apparently, the surface area of the ONO film can be made larger than that permitted by the prior art.

According to the first embodiment, the sidewall spacers 18a is formed by adjusting its thickness. Unlike the prior art, therefore, this embodiment can isolate adjoining gate electrodes from each other without forming a slit therebetween while providing the fabricated device with the same device characteristics as those of the prior art. This can permit design of miniaturized devices and can thus improve the reliability of the semiconductor device fabricated.

SECOND EMBODIMENT

A second embodiment is designed to be able to secure a larger surface area for the ONO film than the first embodiment. The description of those steps of the second embodiment which are the same as the corresponding steps of the first embodiment will not be repeated, and only different steps will be discussed below.

Figure 18:
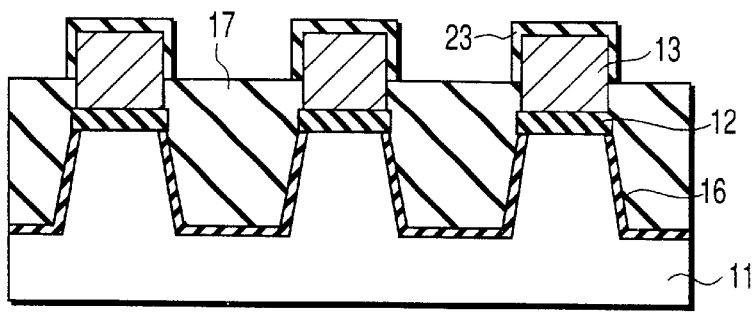
FIG. 18 is a cross-sectional view of a step of fabrication of a semiconductor device according to a second embodiment of this invention.

First, the buried insulating film 17 and oxide film 16 are removed as shown in FIGS. 1 to 8 as per the first embodiment, thereby exposing the upper portion of the first polycrystalline silicon film 13. Thereafter, an oxide film 23 is formed in such a way as to cover the exposed first polycrystalline silicon film 13 as shown in FIG. 18. If the thickness of the oxide film 23 is set to 20 to 40 Å, the direct current is generated, thus ensuring electric connection to the second polycrystalline silicon film 18 which will be discussed later.

Figure 19:
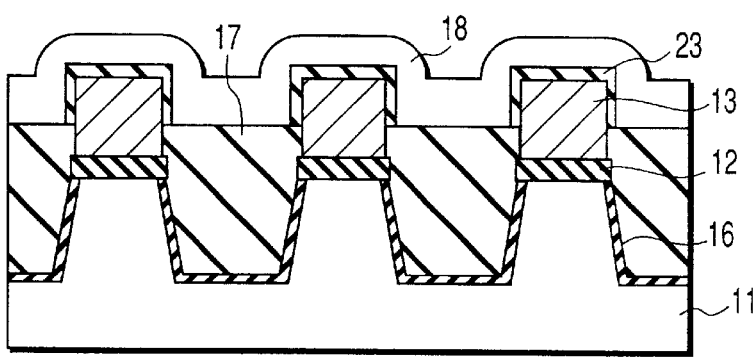
FIG. 19 is a cross-sectional view of a step of fabrication of the semiconductor device according to the second embodiment of this invention, following the step of FIG. 18.
Figure 20:
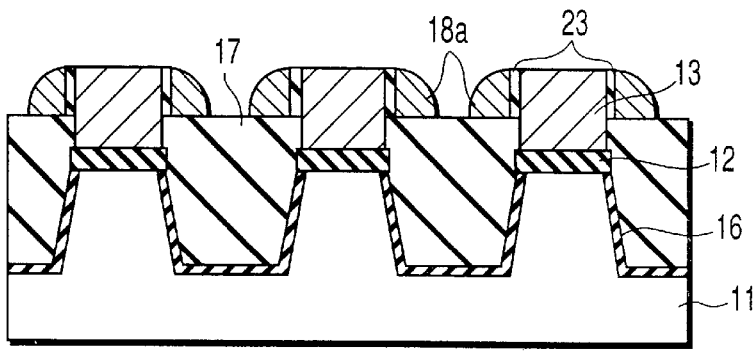
FIG. 20 is a cross-sectional view of a step of fabrication of the semiconductor device according to the second embodiment of this invention, following the step of FIG. 19.

Next, as shown in FIG. 19, the second polycrystalline silicon film 18 is formed on the entire surface. Then, the second polycrystalline silicon film 18 is removed by anisotropic dry etching, forming the sidewall spacers 18a on the side of the first polycrystalline silicon film 13 via the oxide film 23, as shown in FIG. 20.

Figure 21:
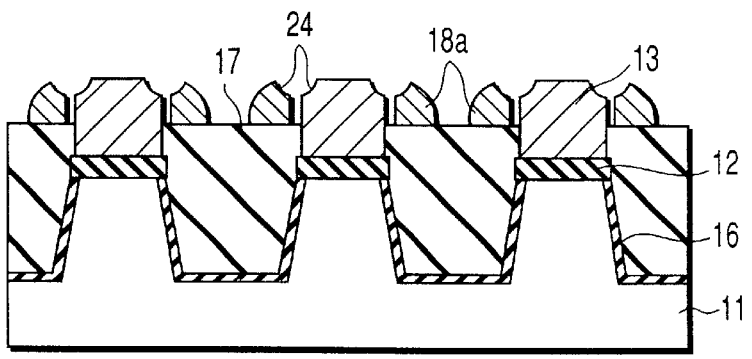
FIG. 21 is a cross-sectional view of a step of fabrication of the semiconductor device according to the second embodiment of this invention, following the step of FIG. 20.
Figure 26:
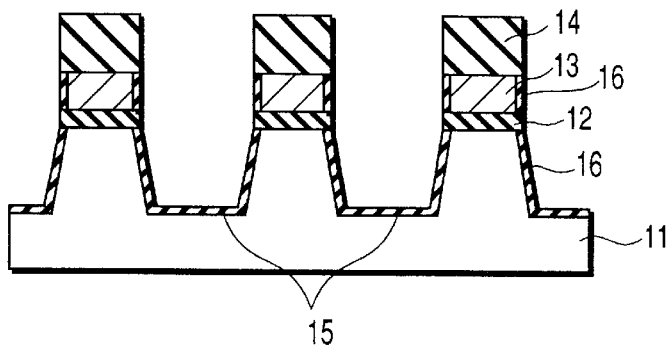
FIG. 26 is a cross-sectional view of a step of fabrication of the semiconductor device according to the prior art, following the step of FIG. 25.
Figure 27:
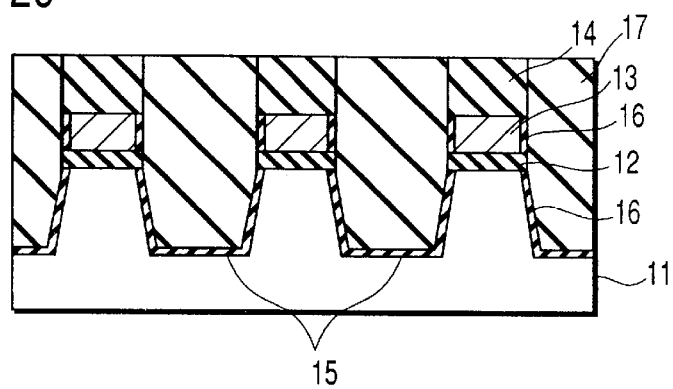
FIG. 27 is a cross-sectional view of a step of fabrication of the semiconductor device according to the prior art, following the step of FIG. 26.
Figure 28:
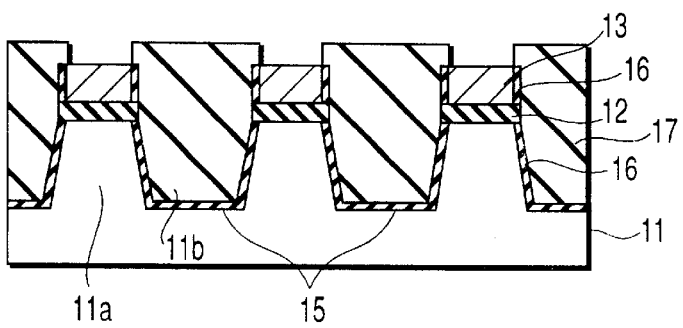
FIG. 28 is a cross-sectional view of a step of fabrication of the semiconductor device according to the prior art, following the step of FIG. 27.
Figure 29:
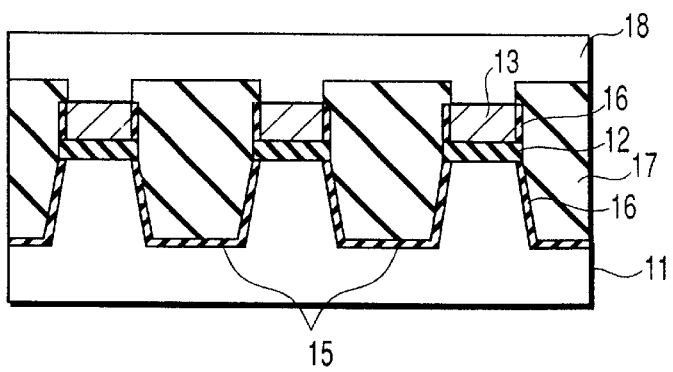
FIG. 29 is a cross-sectional view of a step of fabrication of the semiconductor device according to the prior art, following the step of FIG. 28.
Figure 30:
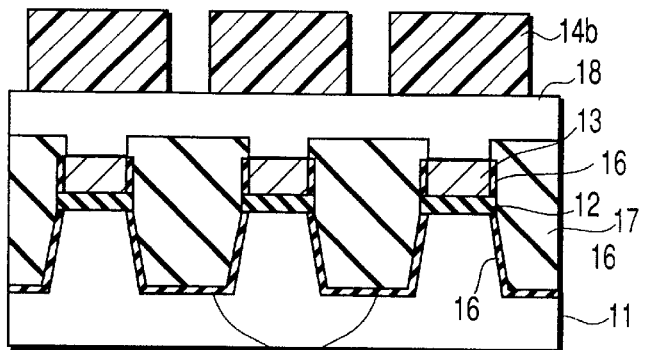
FIG. 30 is a cross-sectional view of a step of fabrication of the semiconductor device according to the prior art, following the step of FIG. 29.
Figure 31:
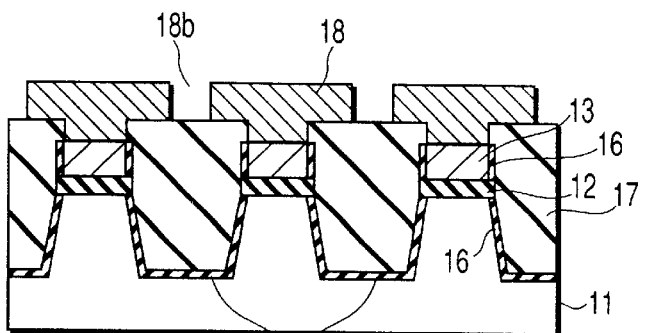
FIG. 31 is a cross-sectional view of a step of fabrication of the semiconductor device according to the prior art, following the step of FIG. 30.
Figure 32:
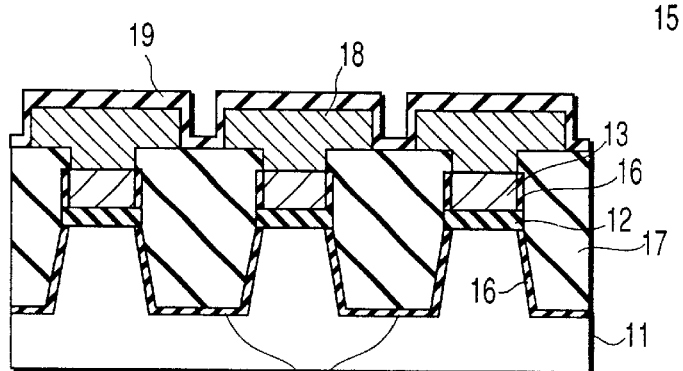
FIG. 32 is a cross-sectional view of a step of fabrication of the semiconductor device according to the prior art, following the step of FIG. 31.
Figure 33:
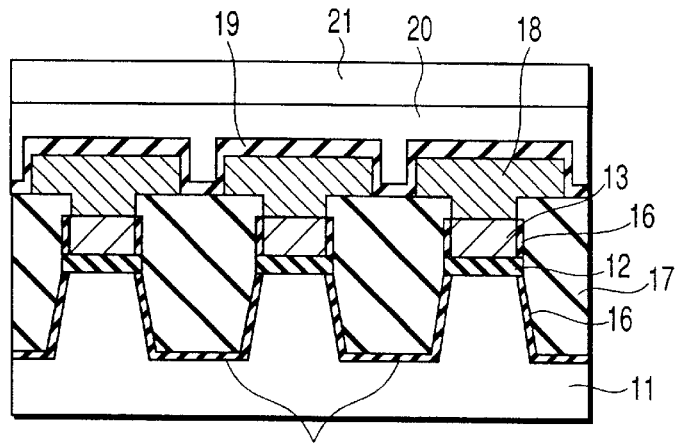
FIG. 33 is a cross-sectional view of a step of fabrication of the semiconductor device according to the prior art, following the step of FIG. 32.

Then, as shown in FIG. 21, parts of the sidewall spacers 18a, comprised of the second polycrystalline silicon film 18, and the first polycrystalline silicon film 13 are etched back, thus forming recesses 24 in the upper portions of the sidewall spacers 18a and the upper edge portion of the first polycrystalline silicon film 13. The recesses 24 are illustrated in enlargement in FIG. 22. At the time of the formation of the recesses 24, the oxide film 23 is removed at the same time. The etch-back is carried out by reducing the etching rate ratio of the second polycrystalline silicon film 18 to the oxide film 23. Then, isotropic etching such as CDE (Chemical Dry Etching) or a wet process is performed.

Thereafter, as shown in FIGS. 11 and 12, the ONO film 19, the third polycrystalline silicon film 20 and the high-melting-point silicide film 21 are formed in the same manner as done in the first embodiment. Through the above procedures, memory cells (not shown) are formed.

The second embodiment has the same advantages as those of the first embodiment. In addition, the recesses 24 are formed in the upper portions of the sidewall spacers 18a and the upper edge portion of the first polycrystalline silicon film 13. This can increase the surface area of the ONO film 19 that is to be formed in a later step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a semiconductor device comprising the steps of:

forming a gate oxide film on a semiconductor substrate;

forming a first polycrystalline silicon film on said gate oxide film;

forming a first insulating film on said first polycrystalline silicon film and then patterning said first insulating film;

removing said first polycrystalline silicon film and said gate oxide film with said patterned first insulating film used as a mask, thereby exposing a surface of said semiconductor substrate;

removing said exposed area of said semiconductor substrate to a desired depth, thereby forming a trench in said semiconductor substrate;

forming an oxide film on exposed surfaces of said semiconductor substrate and said first polycrystalline silicon film;

forming a second insulating film on an entire surface, thereby burying said trench;

planarizing said second insulating film, thereby exposing a surface of said first insulating film;

removing said first insulating film;

removing said second insulating film and said oxide film, thereby exposing an upper portion of said first polycrystalline silicon film;

forming a second polycrystalline silicon film on an entire surface;

removing said second polycrystalline silicon film, thereby forming sidewall spacers on sides of said first polycrystalline silicon film; and forming an ONO film on an entire surface.

2. The method according to claim 1, wherein a relationship of $b \leq a = x < c/2$ is satisfied where x is a thickness of said sidewall spacers, a is a distance from a surface of said first insulating film to a surface of said first polycrystalline silicon film, b is a thickness of said second polycrystalline silicon film at a time of formation thereof and c is a distance between adjoining first polycrystalline silicon films.

3. The method according to claim 1, wherein impurities of a same kind are doped in said first polycrystalline silicon film and said second polycrystalline silicon film.

4. The method according to claim 1, wherein said sidewall spacers are formed by anisotropic dry etching.

5. A method of fabricating a semiconductor device comprising the steps of:

forming a gate oxide film on a semiconductor substrate;

forming a first polycrystalline silicon film on said gate oxide film;

forming a first insulating film on said first polycrystalline silicon film and then patterning said first insulating film;

removing said first polycrystalline silicon film and said gate oxide film with said patterned first insulating film used as a mask, thereby exposing a surface of said semiconductor substrate;

removing said exposed area of said semiconductor substrate to a desired depth, thereby forming a trench in said semiconductor substrate;

forming an oxide film on exposed surfaces of said semiconductor substrate and said first polycrystalline silicon film;

forming a second insulating film on an entire surface, thereby burying said trench;

planarizing said second insulating film, thereby exposing a surface of said first insulating film;

removing said first insulating film;

removing said second insulating film and said oxide film, thereby exposing an upper portion of said first polycrystalline silicon film;

forming a third insulating film in such a way as to cover said exposed upper portion of said first polycrystalline silicon film;

forming a second polycrystalline silicon film on an entire surface;

removing said second polycrystalline silicon film and said third insulating film, thereby forming sidewall spacers on sides of said first polycrystalline silicon film via said third insulating film;

etching back parts of said sidewall spacers and said first polycrystalline silicon film, thereby forming recesses in upper portions of said sidewall spacers and an upper edge portion of said first polycrystalline silicon film; and forming an ONO film on an entire surface.

6. The method according to claim 5, wherein a relationship of $b \leq a = x < c/2$ is satisfied where x is a thickness of said sidewall spacers, a is a distance from a surface of said first insulating film to a surface of said first polycrystalline silicon film, b is a thickness of said second polycrystalline silicon film at a time of formation thereof and c is a distance between adjoining first polycrystalline silicon films.

7. The method according to claim 5, wherein impurities of a same kind are doped in said first polycrystalline silicon film and said second polycrystalline silicon film.

8. The method according to claim 5, wherein said sidewall spacers are formed by anisotropic dry etching.

9. The method according to claim 5, wherein said second insulating film has a thickness of 20 Å to 40 Å.

* * * * *